(12) United States Patent
Afzali-Ardakani et al.

(10) Patent No.: US 8,772,141 B2
(45) Date of Patent: Jul. 8, 2014

(54) DOPING CARBON NANOTUBES AND GRAPHENE FOR IMPROVING ELECTRONIC MOBILITY

(71) Applicant: International Business Machines Corporation, Armonk, NY (US)

(72) Inventors: Ali Afzali-Ardakani, Ossining, NY (US); Bhupesh Chandra, Jersey City, NJ (US); George Stojan Tulevski, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/627,020

(22) Filed: Sep. 26, 2012

(65) Prior Publication Data

US 2013/0137248 A1    May 30, 2013

Related U.S. Application Data

(63) Continuation of application No. 13/306,357, filed on Nov. 29, 2011.

(51) Int. Cl.
*H01L 21/04* (2006.01)
(52) U.S. Cl.
USPC ........... 438/510; 438/558; 438/327; 438/275; 438/694; 257/607; 257/E21.135

(58) Field of Classification Search
USPC .............. 438/931, 276, 426, 510; 257/40, 20, 257/607, E21.135
See application file for complete search history.

(56) References Cited

U.S. PATENT DOCUMENTS

| | | |
|---|---|---|
| 6,891,227 B2 | 5/2005 | Appenzeller et al. |
| 7,132,714 B2 | 11/2006 | Bae et al. |
| 7,253,431 B2 | 8/2007 | Afzali-Ardakani et al. |
| 7,492,015 B2 | 2/2009 | Chen et al. |
| 7,666,382 B2 | 2/2010 | Ghenciu et al. |
| 7,666,708 B2 | 2/2010 | Lieber et al. |

(Continued)

FOREIGN PATENT DOCUMENTS

| | | |
|---|---|---|
| EP | 1998385 A2 | 3/2008 |
| WO | 2008057615 A2 | 5/2008 |

OTHER PUBLICATIONS

Cresti et al., Charge Transport in Disordered Graphene-Based Low Dimensional Materials, Nano Res (2008) 1:361-394.*

(Continued)

*Primary Examiner* — Elias M Ullah
(74) *Attorney, Agent, or Firm* — Ryan, Mason & Lewis, LLP

(57) ABSTRACT

A method for doping a graphene or nanotube thin-film field-effect transistor device to improve electronic mobility. The method includes selectively applying a dopant to a channel region of a graphene or nanotube thin-film field-effect transistor device to improve electronic mobility of the field-effect transistor device.

18 Claims, 8 Drawing Sheets

(56) References Cited

U.S. PATENT DOCUMENTS

| | | |
|---|---|---|
| 2005/0076581 A1* | 4/2005 | Small et al. ............... 51/307 |
| 2006/0038179 A1* | 2/2006 | Afzali-Ardakani et al. .... 257/67 |
| 2006/0063318 A1 | 3/2006 | Datta et al. |
| 2006/0105523 A1 | 5/2006 | Afzali-Ardakani et al. |
| 2007/0258147 A1 | 11/2007 | van der Boom et al. |
| 2008/0001141 A1 | 1/2008 | Gruner et al. |
| 2008/0023066 A1 | 1/2008 | Hecht et al. |
| 2008/0213367 A1 | 9/2008 | Sarkar et al. |
| 2008/0299710 A1 | 12/2008 | Tombler et al. |
| 2008/0308407 A1 | 12/2008 | Rostovtsev et al. |
| 2009/0032804 A1 | 2/2009 | Kalburge |
| 2009/0146111 A1 | 6/2009 | Shin et al. |
| 2009/0179193 A1 | 7/2009 | Appenzeller et al. |
| 2010/0051897 A1 | 3/2010 | Chen et al. |
| 2010/0206362 A1 | 8/2010 | Flood |
| 2010/0308375 A1 | 12/2010 | Birkahn |
| 2011/0048508 A1 | 3/2011 | Afzali-Ardakani et al. |
| 2011/0143045 A1 | 6/2011 | Veerasamy |
| 2011/0284818 A1 | 11/2011 | Avouris et al. |
| 2012/0052308 A1 | 3/2012 | El-Ashry et al. |
| 2012/0056161 A1 | 3/2012 | Avouris et al. |
| 2012/0225296 A1 | 9/2012 | Zhong et al. |
| 2013/0130037 A1* | 5/2013 | Bol et al. ............... 428/408 |

OTHER PUBLICATIONS

Khairoutdinov et al., Persistent Photoconductivity in Chemically Modified Single-Wall Carbon Nanotubes, J. Phys. Chem. B, vol. 108, No. 52, 2004. pp. 19976-19981.

Kavan et al., Supramolecular Assembly of Single-Walled Carbon Nanotubes with a Ruthenium(II)—Bipyridine Complex: An in Situ Raman Spectroelectrochemical Study, J. Phys. Chem. C, vol. 113, No. 6, 2009, pp. 2611-2617.

Shiozawa et al., Screening the Missing Electron: Nanochemistry in Action, Phys. Rev. Lett. 102, 2009, 046804.

Durkop et al., Extraordinary Mobility in Semiconducting Carbon Nanotubes, Nano Letters, vol. 4, No. 1, 2004, pp. 35-39.

Luong et al., Oxidation Deformation, and Destruction of Carbon Nanotubes in Aqueous Ceric Sulfate, J. Phys. Chem. B, vol. 109, No. 4, 2005, pp. 1400-1407, Web Publication date Jan. 8, 2005.

Yang et al., Preparation of Water-Soluble Multi-Walled Carbon Nanotubes by Ce(IV)-induced Redox Radical Polymerization, Progress in Natural Science, vol. 19, 2009, pp. 991-996.

* cited by examiner

DOPING CARBON NANOTUBES AND GRAPHENE FOR IMPROVING ELECTRONIC MOBILITY

CROSS-REFERENCE TO RELATED APPLICATIONS

This application is a continuation of U.S. patent application Ser. No. 13/306,357, filed Nov. 29, 2011 and incorporated by reference herein, which is related to U.S. patent application Ser. No. 13/306,276 filed Nov. 29, 2011, the disclosure of which is also incorporated by reference herein.

FIELD OF THE INVENTION

Embodiments of the invention generally relate to electronic devices and, more particularly, to field effect transistor devices.

BACKGROUND OF THE INVENTION

Graphene and carbon nanotubes (CNT) are candidates for replacing silicon in high and medium performance logic devices. Recently, there is a growing interest in using thin film CNT field effect transistor (FET) devices for medium performance applications such as radio frequency (RF) electronics and transistor backplane for liquid crystal (LCD)/organic light emitting diode (OLED) displays.

The use of CNT-thin film transistors (TFTs) becomes more appealing in case of flexible electronics applications, where CNT-TFTs surpass other material (amorphous silicon (a-Si), organic semiconductors, etc.) in terms of mobility values.

The rising demands for performance from these TFTs make a case for a continuous improvement in the mobility values of CNT based TFTs. However, existing approaches in CNT-TFT lacks a controlled way to improve mobility values in the devices. For example, some existing approaches include increasing tube length, and producing highly purified CNT material to improve mobility values. However, such approaches provide a very small enhancement in material mobility and are not well controlled.

SUMMARY OF THE INVENTION

In one aspect of the invention, a method for doping carbon nanotubes (CNT) and/or graphene for improving electronic mobility is provided. The method includes the steps of selectively applying a dopant to a channel region of a graphene and nanotube thin-film field-effect transistor device to improve electronic mobility of the field-effect transistor device.

Another aspect of the invention includes an apparatus that includes a graphene or nanotube thin-film field-effect transistor device fabricated on a substrate with an exposed channel region, wherein the channel region is doped with a dopant to improve electronic mobility, and contact metal disposed over the doped channel region of the graphene or nanotube thin-film field-effect transistor device.

Yet another aspect of the invention includes an apparatus that includes contact metal, and a graphene or nanotube thin-film field-effect transistor device fabricated on a substrate and disposed over the contact metal, wherein a channel region of the graphene or nanotube thin-film field-effect transistor device is doped with a dopant to improve electronic mobility.

These and other objects, features and advantages of the present invention will become apparent from the following detailed description of illustrative embodiments thereof, which is to be read in connection with the accompanying drawings.

DETAILED DESCRIPTION OF EMBODIMENTS

Figure 1:
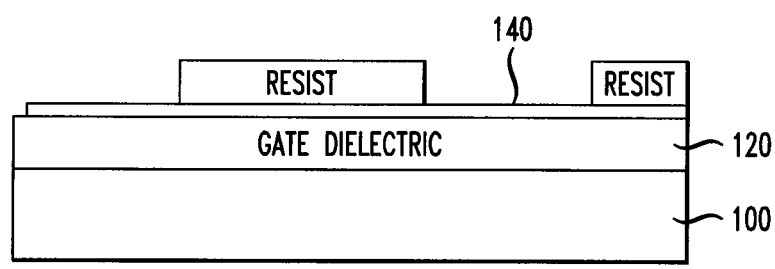
FIG. 1 illustrates a step in forming a field effect transistor (FET), according to an embodiment of the present invention.

An aspect of the invention includes doping carbon nanotubes (CNT), carbon nanotube film and graphene for improving electronic mobility. In at least one embodiment of the invention, channel (or electronic) mobility in CNT-TFT devices is improved significantly with the use of external chemical dopants. The dopant works in multiple ways to improve the channel mobility. For example, the dopant increases the electron concentration in the bulk nanotubes, thereby increasing the tube conductivity. Also, the use of a dopant decreases the tube-tube junction resistance.

Doping is preferably conducted in solution phase, although gas phase doping is also feasible. For solution processes, organic solvents such as dichlorobenzene, dichloromethane, ethanol, acetonitrile, chloroform, methanol, butanol, among others, are suitable. Doping can be accomplished via charge transfer from the dopants to the nano-components, for example, interaction of the lone electron pairs of doping molecules with the quantum confined orbitals of semiconductor nanowires and nanocrystals which affects the concentration of carriers involved in charge transport.

With solution phase doping, for example, nano-components can be doped before and/or after their integration into a circuit on a chip. Nano-components can also be doped locally on the chip using techniques such as inkjet printing. The doping level along a nanowire, nanotube or a nanocrystal film can be varied by masking certain portions (for example, contacts) of the nano-component with resist and doping only the exposed portions. For device applications, nanowires can be protected from damage by implementing the doping at an appropriate stage during process integration.

Nanotubes, for example, carbon nanotubes, can be doped either in bulk by suspension of the nanotubes in a dopant solution, with or without heating; or immersing in the dopant solution a substrate supporting the nanotubes. Although carbon nanotubes are used as examples in the following discussions, doping methods of this invention can also be applied to other semiconducting nanotubes, which may include, for example, graphene, pentascene, fuellerence, etc, and combinations thereof, as well as to other carbon based nanomaterials.

Interaction of carbon nanotubes with the dopants, for example, via charge transfer, results in the formation of charged (radical cation) moeities close to the nanotubes. Bulk doping can be achieved by stirring a suspension of the carbon nanotubes in a dopant solution at a preferred temperature from about 20 degrees Celsius (C) to about 50 degrees C., with a dopant concentration preferably from about 1 millimole (mM) to about 10 moles (M). Depending on the specific dopants and solvents, however, concentration ranging from about 0.0001 M to about 10 M may be used with temperatures from about 0 degrees C. to about 50 degrees C.

In general, the extent of doping depends on the concentration and temperature of the doping medium, and process parameters are selected according to the specific nano-component, dopant and solvent combination, as well as specific application needs or desired device characteristics.

Device doping, that is, doping the nanotube after it has been incorporated as part of a device structure of substrate, can be achieved by exposing the device or substrate with the nanotube to a dopant solution. By appropriately masking the nanotube, selective doping of portions of the nanotube can be achieved to produce desired doping profiles along the nanotube. As noted above, dopant concentration is preferably in the range of about 0.1 mM to about 10 M, more preferably from about 1 mM to about 1 M, and most preferably, from about 1 mM to about 10 mM, with the solution temperature preferably from about 10 degrees C. to about 50 degrees C., and more preferably, from about 20 degrees C. to about 50 degrees C.

With device doping, the choice of process conditions also depends on compatibility with other materials present on the device or substrate. For example, while lower dopant concentrations tend to be less effective in general, too high a concentration of certain dopants may result in potential corrosion issues. In one embodiment, the doping is done under a $N_2$ atmosphere without stirring or agitation of the solution. However, agitation of the solution can be acceptable as long as it does not cause damage to the device.

As detailed below, FIGS. 1-4 illustrate steps of a method for forming a field effect transistor (FET). Accordingly, FIG. 1 illustrates a step in forming a field effect transistor (FET), according to an embodiment of the present invention. A gate dielectric 120 such as silicon dioxide, or oxynitride, or a high Kelvin (K) material layer is deposited on gate 100, which is generally a doped silicon substrate. In an embodiment of the invention, the silicon substrate is degenerately doped. The gate dielectric can have a thickness, for example, from about 1 to about 100 nanometers (nm). A nano-component 140, for example, carbon nanotube, is deposited on gate dielectric 120 by spin-coating.

As used, described and depicted herein, nano-component 140 can refer to a carbon nanotube, a film of carbon nanotubes, a single CNT or CNT film, graphene flakes film or a single layer of graphene. A resist pattern is then formed on the carbon nanotube or carbon nanotube film 140 by conventional lithographic techniques. For example, a resist layer can be deposited over the carbon nanotube or carbon nanotube film 140 and patterned by using e-beam lithography or photolithography. With a positive resist, regions of the resist layer exposed to the e-beam or lithographic radiation are removed by using a developer, resulting in a structure with resist pattern shown in FIG. 1.

The resist pattern formed on the carbon nanotube or carbon nanotube film may have one or multiple separations from about 10 nm to about 500 nm when e-beam lithography is used, and from about 500 nm to about 10 μm with photolithography. The multiple separations correspond to the line and space separations resulting from the respective lithographic techniques, and represent separations between adjacent top gates. The availability of multiple top gates provides flexibility of individual control for different logic applications, for example, AND, OR, NOR operations.

Figure 2:
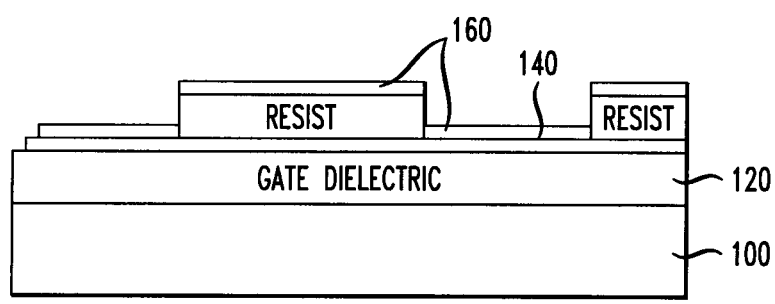
FIG. 2 illustrates a step in forming a field effect transistor (FET), according to an embodiment of the present invention.

As shown in FIG. 2, a metal 160, having a thickness ranging from about 15 nm to about 50 nm, is deposited on the resist pattern and over portions of the carbon nanotube or carbon nanotube film 140. The metal can be Pd, Ti, W, Au, Co, Pt, or alloys thereof, or a metallic nanotube. If a metallic nanotube is used, the metal 160 may include one or more metallic nanotubes. Other metals or alloys of Pd, Ti, W, Au, Co, Pt, can be deposited by e-beam or thermal evaporation under vacuum, while metallic nanotubes can be deposited with solution phase techniques such as spin coating.

Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For example, such solvents can also be referred to generally as resist liftoff components.

Figure 3:
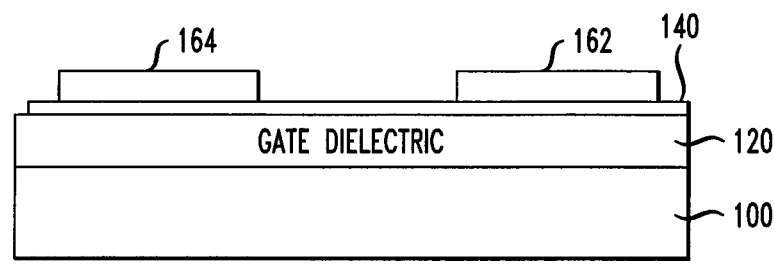
FIG. 3 illustrates a step in forming a field effect transistor (FET), according to an embodiment of the present invention.
Figure 4:
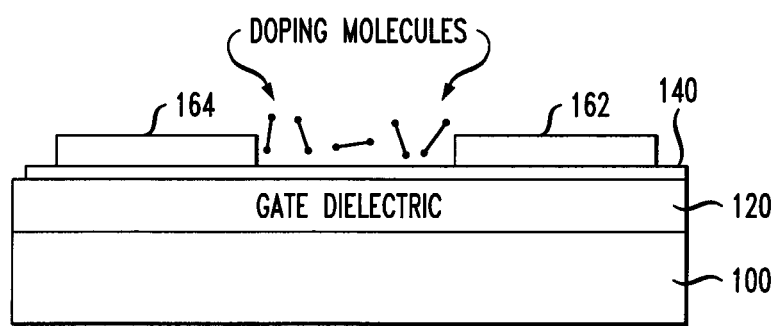
FIG. 4 illustrates a step in forming a field effect transistor (FET), according to an embodiment of the present invention.

As depicted in FIG. 3, the metal portions 162 and 164 remaining on the carbon nanotube or carbon nanotube film 140 form the FET source and drain. In this embodiment, the source and drains are formed over a first and a second region, respectively, of the carbon nanotube or carbon nanotube film 140, or more generally, of the nano-component 140. Following resist liftoff, the structure in FIG. 3 with the carbon nanotube or carbon nanotube film 140 is immersed in an organic solution comprising a suitable dopant as described herein in connection with an embodiment of the invention. FIG. 4 illustrates the doping molecules bonding to the carbon nanotube or carbon nanotube film 140. The doped portion of the carbon nanotube or carbon nanotube film 140 (between the metal source and drain) acts as the channel of the FET.

Figure 5:
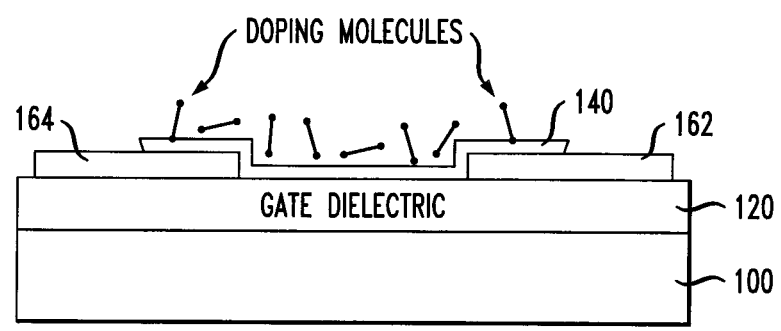
FIG. 5 illustrates another embodiment of forming a carbon nanotube FET (CNFET), according to an embodiment of the present invention.

FIG. 5 illustrates another embodiment of forming a carbon nanotube or carbon nanotube film PET, or more generally, a FET with a channel comprising a nano-component such as other semiconducting nanotubes, nanowires or nanocrystal films. After the formation of gate dielectric 120 on substrate 100, metal portions 162 and 164 are formed on gate dielectric 120 using a resist liftoff process (not shown) similar to that described for FIGS. 1-4. Metal portions 162 and 164, each having a thickness from about 15 nm to about 300 nm, form the FET source and drain. Metals such as Pd, Ti, W, Au, Co and Pt, and alloys thereof, or one or more metallic nanotubes can be used for the metal portions 162, 164.

A carbon nanotube or carbon nanotube film 140, or more generally, a nano-component, is then disposed, for example, by spin-coating, over the gate dielectric 120 and the metal portions 162 and 164. Blanket doping of the carbon nanotube or carbon nanotube film 140 is achieved by immersing the structure in an organic solution comprising a suitable dopant. The dopant molecules bond to the carbon nanotube or carbon nanotube film, for example, via charge transfer interaction with the nitrogen of a dopant (for example, such as detailed herein) donating a lone pair of electrons to the carbon nanotube or carbon nanotube film. In this illustration, the portion of the carbon nanotube or carbon nanotube film 140 in contact with the gate dielectric 120 forms the channel of the FET.

Alternatively, the carbon nanotube or carbon nanotube film 140 can be selectively doped through a patterned resist (not shown) that is formed over the carbon nanotube or carbon nanotube film 140. The patterned resist may be formed, for example, by depositing a suitable resist material over the carbon nanotube or carbon nanotube film 140 and patterning using conventional lithographic techniques. Hydrogensilsesquioxanes (HSQ), a dielectric that can be used as a negative resist, may be used for this purpose. Also, in an aspect of the invention, conventional resist materials can be used such as poly(methyl methacrylate) (PMMA), etc. This is made possible due to the use of water soluble dopants such as cerium ammonium nitrate, cerium ammonium sulfate, and ruthenium bipyridyl complex.

Figure 6:
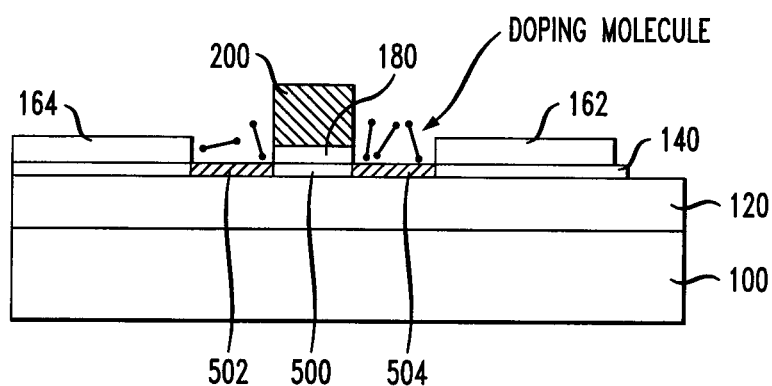
FIG. 6 illustrates an embodiment of a dual-gate CNFET, according to an embodiment of the present invention.

FIG. 6 illustrates an embodiment of a dual-gate carbon nanotube (or carbon nanotube film) FET, or more generally, a FET with a channel comprising a nano-component such as other semiconducting nanotubes, nanowires or nanocrystal films. After the gate dielectric 120 is formed over the substrate 100, which acts as a first gate (also referred to as a bottom or back gate), a carbon nanotube or carbon nanotube film, or more generally, a nano-component 140, is deposited on gate dielectric 120.

Metal portions 162, 164 are formed over the carbon nanotube or carbon nanotube film 140 using a resist liftoff technique such as that described in connection with FIGS. 1-4. After metal portions 162, 164 are formed (acting as source and drain of the FET), the structure containing the carbon nanotube or carbon nanotube film 140 and metal portions 162, 164 is covered with a dielectric layer 180, which can be a low temperature oxide (LTO) or a CVD high dielectric material such as hafnium dioxide.

A second gate 200 (also referred to as top or front gate), which can include a metal or highly doped polysilicon, is formed over the dielectric layer 180, for example, by first depositing a gate material over dielectric layer 180 and then patterning to form top gate 200. With the top gate 200 acting as an etch mask, the dielectric layer 180 is etched such that only the portion underneath the top gate 200 remains, as shown in FIG. 6. As an example, a dilute hydrofluoric acid (HF) such as 100:1 HF can be used as an etchant for LTO.

Additionally, the device is immersed in a dopant solution to achieve partial doping of the carbon nanotube or carbon nanotube film 140. In this case, the channel includes both the gated undoped region 500 and the two doped regions 502 and 504. The doped regions 502 and 504 act like the "extensions" of a complementary metal-oxide-semiconductor (CMOS) FET, resulting in reduced contact barrier and improvements in drive current and transistor switching. The device can be operated by either the top gate 200 or the bottom gate 100, or both. In logic applications, it is desirable to operate a FET with the top gate configuration for good AC performance.

Figure 7:
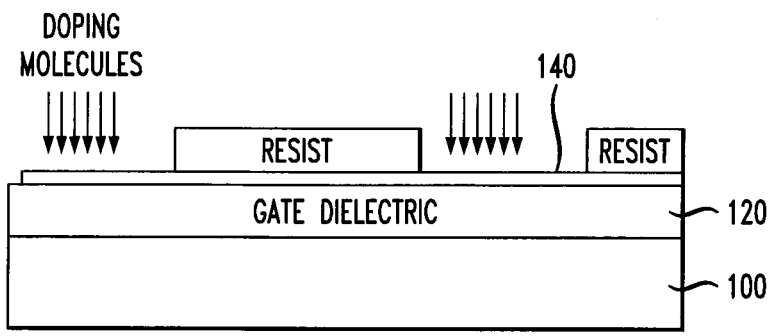
FIG. 7 illustrates a step in another embodiment of forming a CNFET, according to an embodiment of the present invention.
Figure 8:
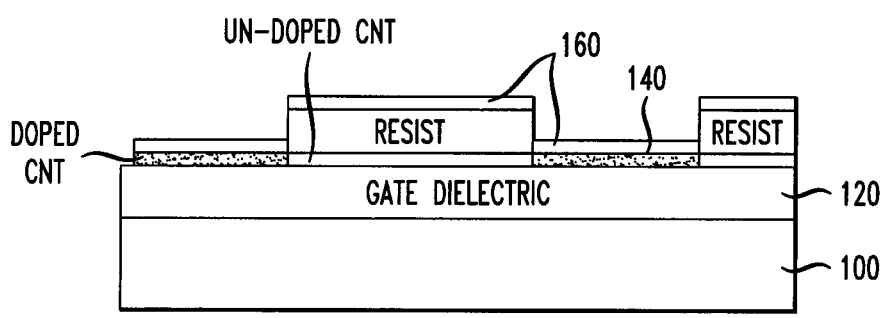
FIG. 8 illustrates a step in another embodiment of forming a CNFET, according to an embodiment of the present invention.
Figure 9:
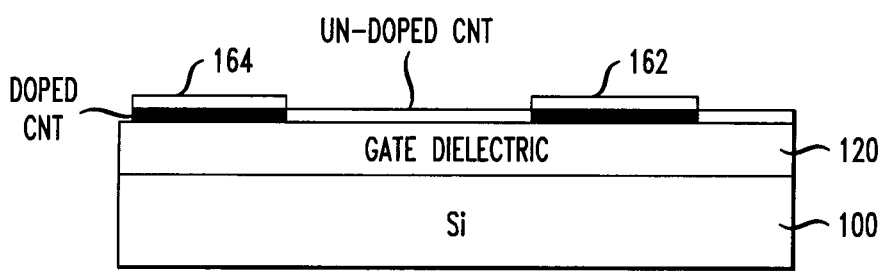
FIG. 9 illustrates a step in another embodiment of forming a CNFET, according to an embodiment of the present invention.

As detailed below, FIGS. 7-9 illustrate steps in another embodiment of forming a carbon nanotube or carbon nanotube film FET, or more generally, a FET with a channel comprising a nano-component such as other semiconducting nanotubes, nanowires or nanocrystal films. After the carbon nanotube, carbon nanotube film or nano-component 140 is deposited on gate dielectric 120, which has previously been formed over substrate 100, a patterned resist is formed on the carbon nanotube or carbon nanotube film 140 using conventional lithographic techniques such as e-beam or photolithography.

The structure (shown in FIG. 7) containing the patterned resist and carbon nanotube or carbon nanotube film 140 is immersed in an organic solution including a suitable dopant (as detailed herein). The doping molecules bond to the exposed portions of the carbon nanotube or carbon nanotube film 140. Following doping of the nanotube 140, a metal layer 160 having a thickness ranging from about 15 nm to about 50 nm is deposited over the patterned resist and the doped carbon nanotube or carbon nanotube film 140. As previously described, Pd, Ti, W, Au, Co, Pt, or alloys thereof, or one or more metallic nanotubes can be used for metal 160. Metallic nanotubes can be deposited using solution phase techniques such as spin coating, while electron beam or vacuum evaporation can be used for deposition of other metals or alloys.

Following deposition of the metal, the structure shown in FIG. 8 is immersed in acetone or NMP for resist liftoff. As shown in FIG. 9, metal portions 162, 164 remaining after resist liftoff form the source and drain of the FET. The process of FIGS. 7-9 generates a significant doping profile difference along the channel of the carbon nanotube (or carbon nanotube film) transistor. Note that in this case, the undoped portion (portion 500 in FIG. 6, for example) of the carbon nanotube or carbon nanotube film 140 forms the channel of the FET.

To complete the formation of the FET devices illustrated in FIGS. 1-9, passivation can be performed by covering the respective devices with a spin-on organic material like poly(methyl methacrylate) (PMMA) or hydrogensilsesquioxanes (HSQ)—a low K dielectric layer, or by depositing a low temperature dielectric film such as silicon dioxide. Further processing of the device is accomplished via metallization for the back-end of the line.

Accordingly, an embodiment of the invention includes achieving a light doping of nanotubes so that the ON/OFF ratio of the CNT-TFT remains unchanged. The ON/OFF ratio is the ratio of the ON Current to the OFF current of a FET. ON current is described as the current value when the transistor is in an ON state with the channel populated with carriers, and OFF current is the current value when the transistor is in an OFF state and the channel is depleted of carriers. Such a requirement can be relaxed in another embodiment of the invention, where the ON/OFF ratio is preserved by doping selective regions for the channel patterned through photolithography.

In contrast to disadvantageous existing approaches, at least one aspect of the invention includes implementing a scalable process. Also, the use of water based nanotube dopants allow for doping channel regions patterned through lithography processes. Further, as detailed herein, channel mobility can be increased in a controlled way through checking doping time and dopant concentrations.

In at least one aspect of the invention, carbon nanotube or carbon nanotube film/graphene dopant solution can be prepared from mixing a number of charge transfer doping compounds in a variety of solvents. By way of example, charge transfer doping compounds can include (Cerium Ammonium Nitrate, Cerium Ammonium Sulfate, Ruthenium bipyridyl complex, triethyloxonium hexachloro antimonate, etc. Additionally, example solvents can include water, dichloroethane, alcohols, dichlorobenzene, etc. at concentrations ranging, by way merely of example, from 0.1 millimolar (mM)-100 mM.

As detailed herein, in one embodiment of the invention, a nanotube or graphene FET device fabricated on a substrate with an exposed channel region is dipped in a dopant solution for a period of time from approximately one second to 10 hours, depending upon of the concentration of the solution used. (A stronger concentration will require a shorter the duration.) The substrate is then removed from dopant solution and rinsed with a respective dopant solvent. In an example embodiment, the substrate is cleaned with an amount of solvent (water, ethanol, etc.) sufficient to remove excess dopant solution (that is, to remove the unreacted dopant molecules).

Another embodiment of the invention can be carried out with a CNT/graphene FET device where the channel region is patterned with a polymer and only selective parts of the channel are exposed for doping. Additionally, the doping can also be carried out by stamping the dopant directly over the FET channel areas. This stamping can be performed using techniques such as polymer based stamps (PDMS), ink jet printing, brushing, screen printing, etc.

Figure 10:
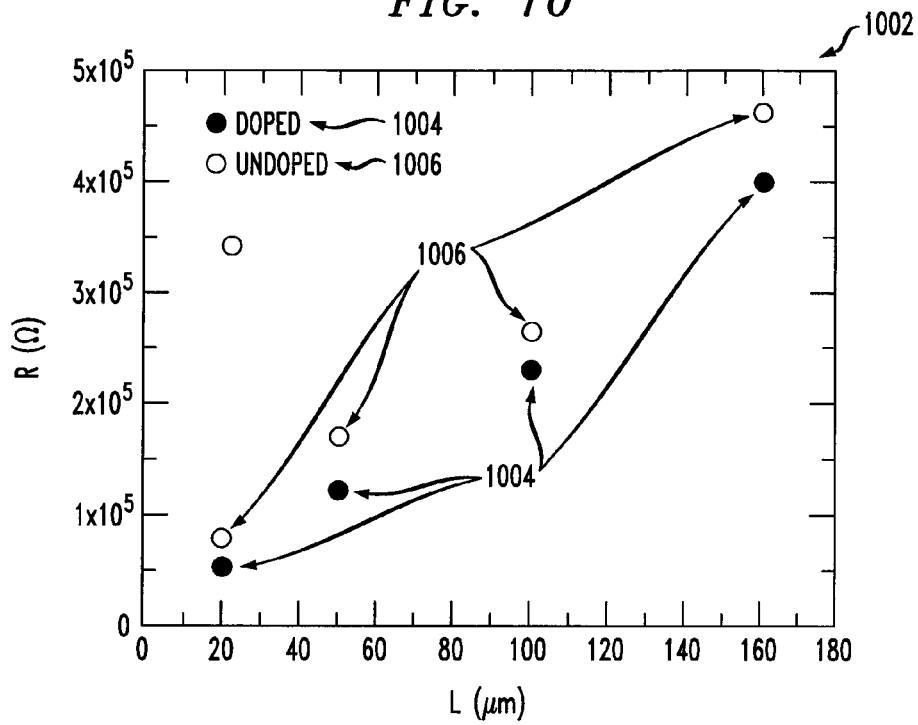
FIG. 10 includes a graph illustrating channel resistance versus channel length for a carbon nanotube thin film transistor before and after doping of the contact using Ruthenium Bipyridyl Complex.

FIG. 10 includes a graph 1002 illustrating channel resistance versus channel length for a carbon nanotube thin film transistor before 1006 and after 1004 doping of the contact using Ruthenium Bipyridyl Complex. Graph 1002 is indicating a downward shift in the R versus L graph with contact doping. Because the y-intercept of the line denotes the contact resistance of the FET device, a downward shift implies a decrease in the contact resistance with contact doping.

Figure 11:
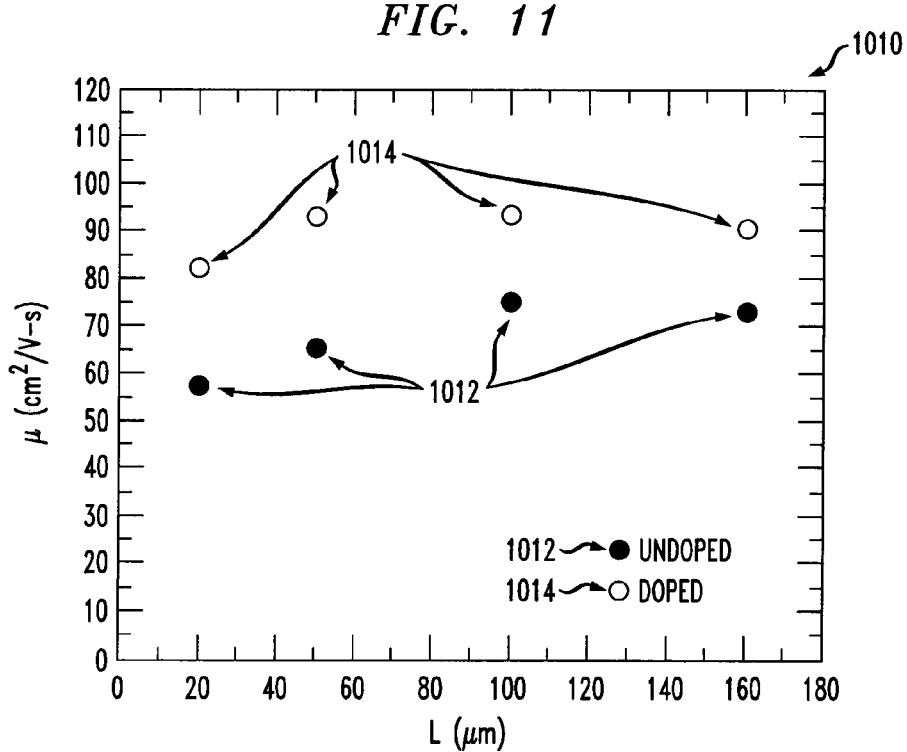
FIG. 11 includes a graph illustrating mobility versus channel length for a carbon nanotube thin film transistor before and after doping of the contact using Ruthenium Bipyridyl Complex.

FIG. 11 includes a graph 1010 illustrating mobility versus channel length for a carbon nanotube thin film transistor before 1012 and after 1014 doping of the contact using Ruthenium Bipyridyl Complex. Graph 1010 is depicting the mobility of the FET device being increased with doping of the contacts.

Figure 12:
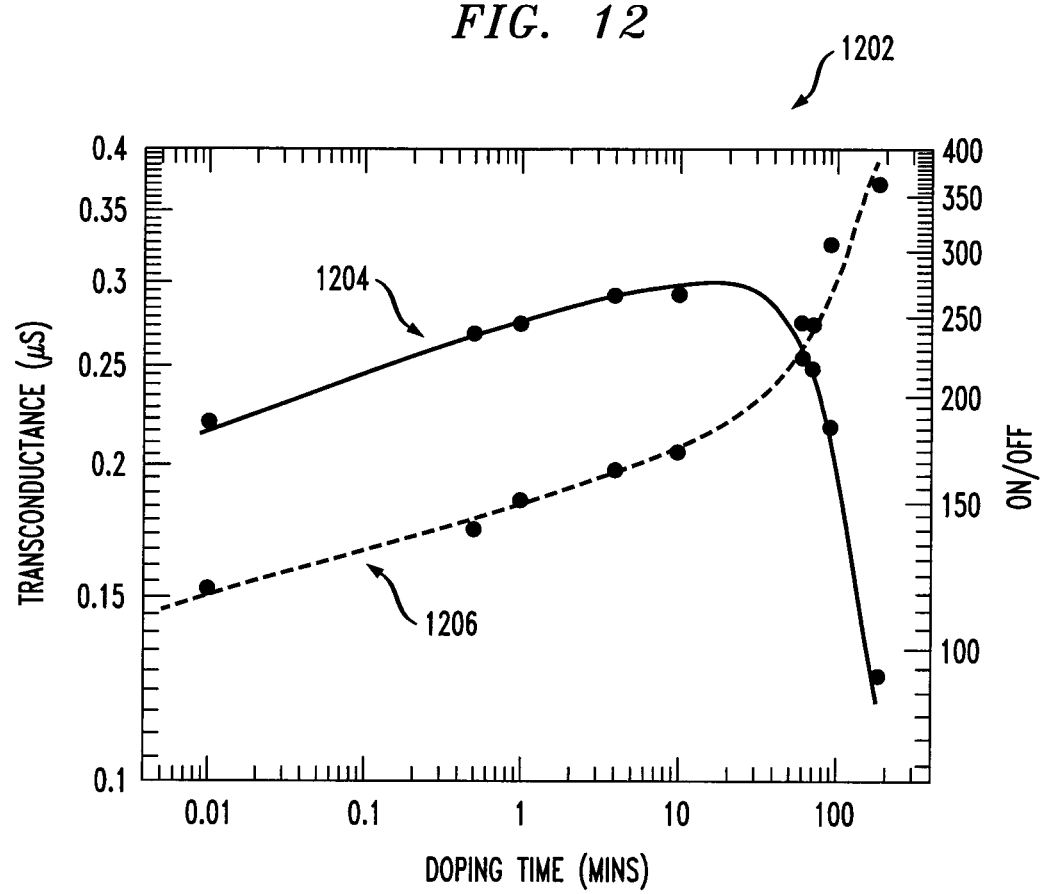
FIG. 12 includes a graph illustrating channel doping effects, according to an embodiment of the present invention.

The effect of channel doping on the transconductance (and hence mobility) of a CNT-TFT device is shown in FIG. 12. FIG. 12 is a graph 1202 illustrating channel doping effects, according to an embodiment of the present invention. By way of illustration, the first Y-axis shows the change of transconductance with doping time (corresponding to curve 1206), and the second Y-axis shows the change of ON/OFF ratio with doping time (corresponding to curve 1204). It is evident that at short doping times (that is, a lightly doped channel), the transconductance of the CNT-TFT can be increased without sacrificing ON/OFF ratio.

Graph 1202 illustrates a salient aspect of the invention. As noted, curve 1206 represents the transconductance (left axis) while curve 1204 curve represents ON/OFF ratio (right axis). The X-axis represents the 'channel' doping time. As shown, the greater the time, the higher the channel doping. It is also shown through this graph that as the channel doping increases with doping time, the transconductance of the FET defined as a ratio of change in drain current per unit change in gate voltage ($dI_d/dV_G$) increases as well. Transconductance is a direct measure of channel mobility. Hence, the channel mobility can be increased with channel doping.

Moreover, as the channel mobility is increasing, none of the ON/OFF ratio is being sacrificed. However, if doped for more than a specific time period, the ON/OFF ratio starts dropping due to too the inability of the back gate to turn the device OFF as the channel is overpopulated with carriers inserted by chemical doping.

Therefore, an example embodiment of the invention demonstrates that a light doping is helpful in increasing the channel mobility of a CNT thin film transistor device without sacrificing ON/OFF ratio. As an extension, this technique can be used with materials such as CNT-graphene hybrid or films made up of graphene-graphene flakes, where interfacial resistance between material domains dominated the transport.

At least one embodiment of the invention additionally includes using a water doping medium and/or a water soluble doping medium (for example, ruthenium (III)) to make the doping process complementary metal-oxide-semiconductor (CMOS) compatible. In such an embodiment, the dopant solution does not dissolve away the photoresist because dopant is not in an organic solvent. Accordingly, a selective region in a FET channel or the complete channel can be doped to increase the electron mobility without compromising on the ON/OFF ratio.

Figure 13:
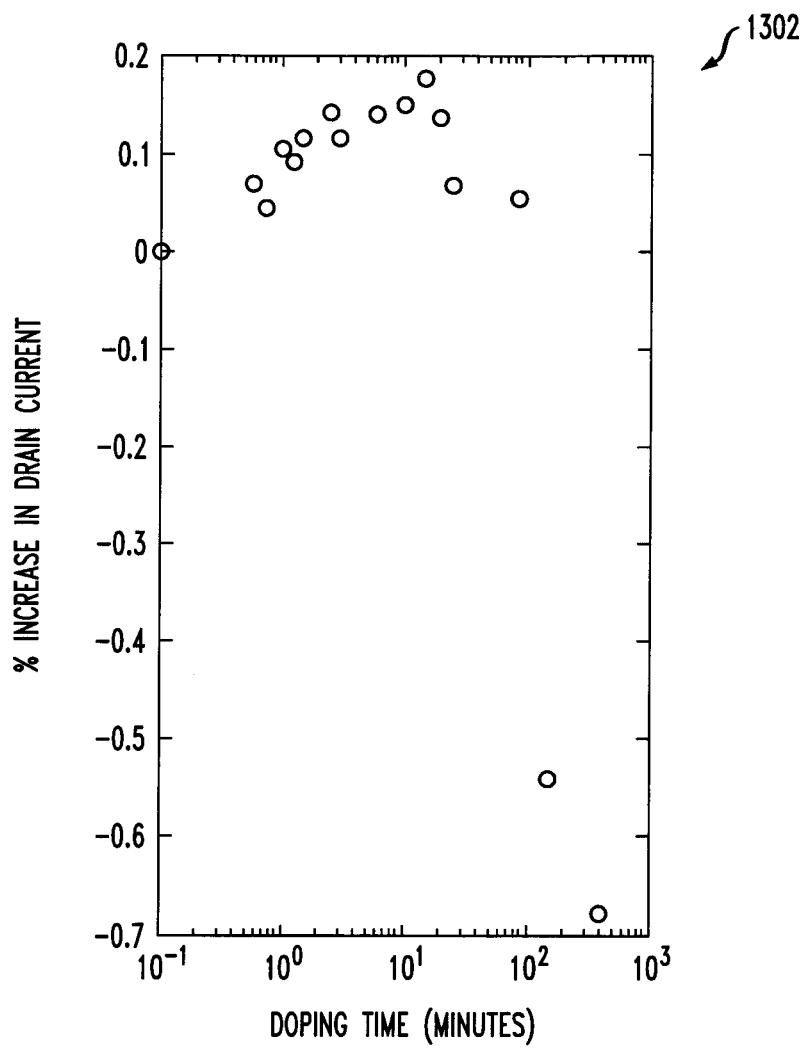
FIG. 13 includes a graph illustrating FET channel doping using Ruthenium Bipyridyl complex, according to an embodiment of the present invention.
Figure 14:
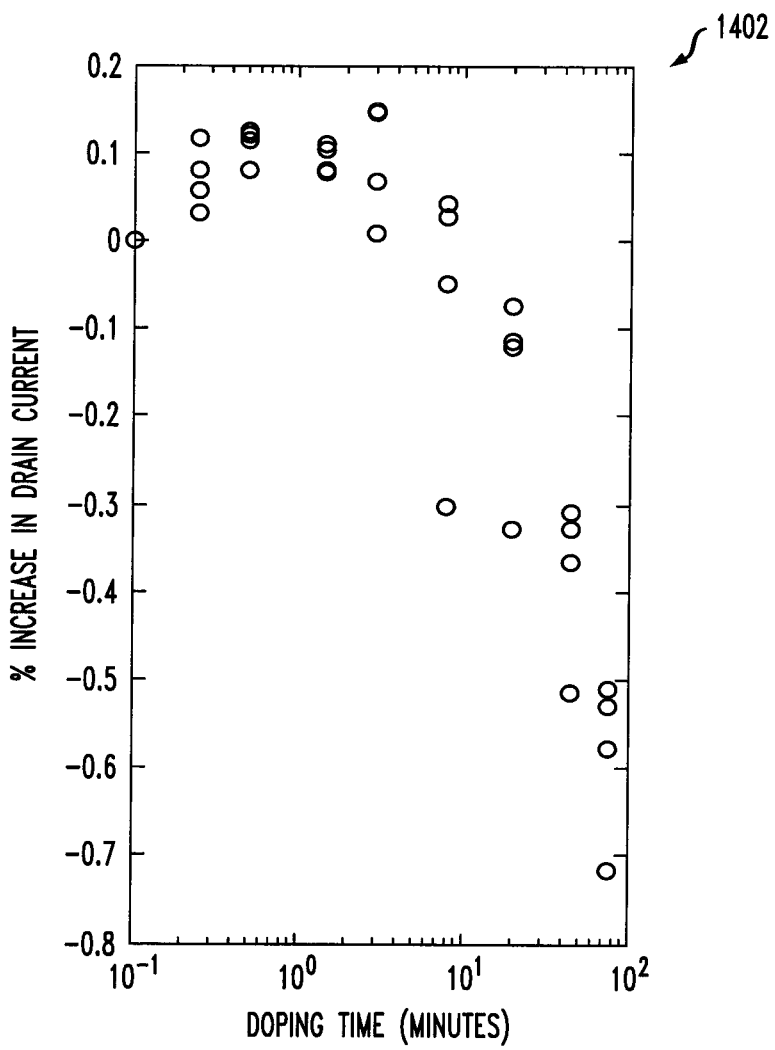
FIG. 14 includes a graph illustrating FET channel doping using Ruthenium Bipyridyl complex, according to an embodiment of the present invention.

Also, an increase in mobility of a channel of FET made of CNT/graphene can be accomplished using time-specific doping. As detailed below, FIG. 13 and FIG. 14 illustrate the time dependence of channel doping. The ON current in the Y-axis is a measure of the channel mobility. It is shown that with an increase in doping time, the ON current increases to a level and then starts decreasing. Similarly, the same can be said, for example, for FIG. 12, where doping time is in the X axis and transconductance is a measure of the channel mobility.

FIG. 13 includes a graph illustrating FET channel doping using Ruthenium Bipyridyl complex, according to an embodiment of the present invention. By way of illustration, graph 1302 depicts FET channel doping using Ruthenium Bipyridyl complex, with a dopant concentration of approximately 5 mM. Graph 1302 shows the doping time dependence of drain current. Until time <10 minutes, the doping has a positive effect on channel current (increased by approximately 20%); however, for longer times the current starts decreasing.

FIG. 14 includes a graph illustrating FET channel doping using Ruthenium Bipyridyl complex, according to an embodiment of the present invention. By way of illustration, graph 1402 depicts FET channel doping using Ruthenium Bipyridyl complex, with a dopant concentration of approximately 10 mM. Graph 1402 shows the doping time dependence of drain current. Until time <10 minutes, the doping has a positive effect on channel current (increased by approximately 10-15%); however, for longer times the current starts decreasing.

As detailed herein, an aspect of the present invention includes techniques for doping a graphene or nanotube field-effect transistor device to improve electronic mobility, including the step of selectively applying a dopant to a channel region of a graphene or nanotube field-effect transistor device to improve electronic mobility of the field-effect transistor device.

Such a technique can additionally include depositing contact metal over the doped channel region of the graphene or nanotube field-effect transistor device. Additionally, selectively applying a dopant to a channel region of a graphene (thin film of graphene flakes) or nanotube field-effect transistor device to improve electronic mobility of the field-effect transistor device includes decreasing resistance (tube-tube resistance or flake-flake resistance) of the field-effect transistor device. This effect happens due to the fact that dopant gets at the interfaces of these domains and increases the local charge concentration.

In at least one embodiment of the invention, the dopant is a dopant solution. Selectively applying a dopant solution to a channel region of a graphene or nanotube field-effect transistor device can include placing the graphene or nanotube field-effect transistor device in a dopant solution for a duration of time (for example, a range of one second to ten hours). Also, the duration of time can be based on the concentration of the dopant being applied. If doped at a high concentration and/or for a long duration of time, the dopant molecule can possibly form a thick layer and prevent the electron transmission from metals.

As noted herein, the graphene or nanotube field-effect transistor device can be removed from the dopant solution and rinsed with a dopant solvent (for example, to remove the dopant solution from non-channel regions of the graphene or nanotube field-effect transistor device with a dopant solvent).

In another embodiment of the invention, the dopant is in a gel mixture in which the gel evaporates after application. Such an implementation is particularly effective for the process where the dopant is stamped. Accordingly, selectively applying a dopant to a channel region of a graphene or nanotube field-effect transistor device includes stamping the dopant directly over the channel region of the graphene and nanotube field-effect transistor device.

As detailed herein, an apparatus implementing the techniques described above can include a substrate (such as silicon/silicon oxide, silicon nitride, plastic, etc.), a graphene or nanotube field-effect transistor device fabricated on the substrate with an exposed channel region, wherein the channel region is doped with a dopant (in solution or gel form) to improve electronic mobility, and contact metal deposited over the doped channel region of the graphene and nanotube field-effect transistor device. Contact metal can include compositions such as Au, Pd, Ag, Pt, etc.

Additionally, in another aspect of the invention, such an apparatus can include contact metal, a substrate, and a graphene or nanotube field-effect transistor device fabricated on the substrate and deposited over the contact metal, wherein a channel region of the FET is doped with a dopant (in solution or gel form) to improve electronic mobility. That is, graphene and/or CNT electrical materials are transferred over pre-fabricated electrodes, and the channel regions are selectively doped.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for doping a graphene field-effect transistor device to improve electronic mobility, comprising:
   selectively applying a dopant to a channel region of a graphene field-effect transistor device to improve electronic mobility of the field-effect transistor device, wherein said dopant comprises at least one of cerium ammonium nitrate and cerium ammonium sulfate.

2. The method of claim 1, further comprising depositing contact metal over the doped channel region of the graphene field-effect transistor device.

3. The method of claim 1, wherein the dopant is a dopant solution.

4. The method of claim 3, wherein the dopant solution comprises a mixture of at least one charge transfer doping compound in a solvent at a concentration in a range of 0.1 millimole (mM) to 100 mM.

5. The method of claim 4, wherein the at least one charge transfer doping compound comprises ruthenium bipyridyl complex.

6. The method of claim 4, wherein the at least one charge transfer doping compound comprises triethyloxonium hexachloro antimonate.

7. The method of claim 4, wherein the solvent comprises at least one of water, dichloroethane, alcohol, and dichlorobenzene.

8. The method of claim 1, wherein the dopant is in a gel mixture in which the gel evaporates after application.

9. The method of claim 1, wherein selectively applying a dopant to a channel region of a graphene field-effect transistor device comprises placing the graphene field-effect transistor device in a dopant solution for a duration of time.

10. The method of claim 9, wherein the duration of time comprises a range of one second to ten hours.

11. The method of claim 9, wherein the duration of time is based on a concentration of the dopant being applied.

12. The method of claim 9, further comprising removing the graphene field-effect transistor device from the dopant solution and via rinsing with a dopant solvent.

13. The method of claim 1, wherein selectively applying a dopant to a channel region of a graphene field-effect transistor device to improve electronic mobility of the field-effect transistor device further comprises decreasing resistance of the field-effect transistor device.

14. The method of claim 1, wherein selectively applying a dopant to a channel region of a graphene field-effect transistor device comprises stamping the dopant directly over a channel area of the graphene field-effect transistor device.

15. The method of claim 14, wherein stamping comprises using one of a polymer based stamp, ink jet printing, brushing, and screen printing.

16. A method for doping a carbon nanotube thin-film transistor (CNT-TFT) device to improve electronic mobility, comprising:
   selectively applying a dopant to a channel region of a carbon nanotube thin-film transistor (CNT-TFT) device to improve electronic mobility of the transistor device, wherein said dopant comprises at least one of cerium ammonium nitrate and cerium ammonium sulfate.

17. The method of claim 16, further comprising depositing contact metal over the doped channel region of the nanotube thin-film transistor (CNT-TFT) device.

18. The method of claim 16, wherein the dopant comprises a dopant solution comprising a mixture of at least one charge transfer doping compound in a solvent at a concentration in a range of 0.1 millimole (mM) to 100 mM, wherein the at least one charge transfer doping compound comprises at least one of ruthenium bipyridyl complex, and triethyloxonium hexachloro antimonite.

* * * * *